United States Patent
Miyazaki et al.

(10) Patent No.: US 7,495,333 B2
(45) Date of Patent: Feb. 24, 2009

(54) SEAL COVER STRUCTURE COMPRISING A NICKEL-TIN (NI—SN) ALLOY BARRIER LAYER FORMED BETWEEN A NICKEL (NI) PLATING LAYER AND A GOLD-TIN (AU—SN) BRAZING LAYER HAVING SN CONTENT OF 20.65 TO 25 WT % FORMED ON THE SEAL COVER MAIN BODY

(75) Inventors: Kenichi Miyazaki, Hiratsuka (JP); Hiroyuki Kusamori, Hiratsuka (JP)

(73) Assignee: Tanaka Kikinzoku Kogyo K.K., Tokyo (JP)

( * ) Notice: Subject to any disclaimer, the term of this patent is extended or adjusted under 35 U.S.C. 154(b) by 75 days.

(21) Appl. No.: 11/124,498

(22) Filed: May 6, 2005

(65) Prior Publication Data
US 2006/0001172 A1    Jan. 5, 2006

(30) Foreign Application Priority Data
Jun. 21, 2004    (JP) ............... P2004-181968

(51) Int. Cl.
*H01L 23/10*    (2006.01)
*B23K 31/02*    (2006.01)

(52) U.S. Cl. ............... 257/704; 257/710; 257/E21.519; 228/124.6; 228/226.3

(58) Field of Classification Search ................ 257/704, 257/710; 228/124.6, 226.3
See application file for complete search history.

(56) References Cited

U.S. PATENT DOCUMENTS

| | | | |
|---|---|---|---|
| 4,746,583 A | | 5/1988 | Falanga ............... 428/632 |
| 4,827,082 A | * | 5/1989 | Horiuchi et al. ............ 174/50.5 |
| 4,941,582 A | * | 7/1990 | Morikawa et al. ......... 220/2.1 R |
| H1934 H | * | 1/2001 | Dautartas ............... 137/454 |
| 6,691,911 B2 | * | 2/2004 | Iwai et al. ............... 228/124.6 |
| 7,114,644 B2 | * | 10/2006 | Miyazaki ............... 228/208 |
| 2002/0190106 A1 | | 12/2002 | Iwai et al. ............... 228/124.6 |
| 2004/0026769 A1 | | 2/2004 | Nakamura ............... 257/686 |
| 2004/0100164 A1 | * | 5/2004 | Murata et al. ............... 310/348 |
| 2005/0063161 A1 | * | 3/2005 | Yanase et al. ............... 361/707 |

FOREIGN PATENT DOCUMENTS

| | | |
|---|---|---|
| EP | 0392539 A2 | 10/1990 |
| EP | 0569166 A1 | 11/1993 |
| EP | 1231015 A1 | 8/2002 |
| JP | 63240051 A | 10/1988 |
| JP | 11095070 A | 4/1999 |
| JP | 2003-142615 | 5/2003 |

* cited by examiner

*Primary Examiner*—Anh D Mai
(74) *Attorney, Agent, or Firm*—Roberts & Roberts, LLP

(57) ABSTRACT

A hermetic seal cover capable of inhibiting defects such as voids from generating in sealing a package, and a method of manufacturing the seal cover are provided. The hermetic seal cover comprises: a seal cover main body; a Ni plating layer applied onto a surface of the seal cover main body; and a Au—Sn brazing material layer fusion bonded to a surface of the Ni plating layer, and is characterized by a Ni—Sn ally layer disposed between the Ni plating layer and the Au—Sn brazing material layer. It is preferable if the Ni—Sn alloy layer has a thickness of 0.6-5.0 μm. It is also preferable if Au—Sn brazing material layer has a Sn content of 20.65-23.5 wt %.

4 Claims, 5 Drawing Sheets

SEAL COVER STRUCTURE COMPRISING A NICKEL-TIN (NI—SN) ALLOY BARRIER LAYER FORMED BETWEEN A NICKEL (NI) PLATING LAYER AND A GOLD-TIN (AU—SN) BRAZING LAYER HAVING SN CONTENT OF 20.65 TO 25 WT % FORMED ON THE SEAL COVER MAIN BODY

BACKGROUND OF THE INVENTION

1. Field of the Invention

The present invention relates to a hermetic seal cover to be used in hermetically sealing a package for various electronic parts.

2. Description of the Related Art

Semiconductor devices such as SAW filters and quartz oscillators, which are used in various electronic appliances for, for instance a cellular phone are normally used with the devices enclosed in a ceramic-made container (package), which prevents oxidation or deterioration due to moisture or oxygen. The semiconductor package comprises: a container (base), which has openings and hermetically seals devices; and a seal cover acting as a lid. A process for hermetically sealing a semiconductor package is effected through placing semiconductor devices on a base, placing a seal cover on the devices, and subsequently joining the base and the seal cover.

A typical method out of various ones for joining a base and a seal cover is a brazing method, in which joining is effected with the use of brazing materials. A seal cover to be used in the brazing method has on a joint surface thereof brazing materials fusion-bonded, and in hermetic sealing, the seal cover is allowed to cover the base, and the seal cover and the base are heated by the use of any heating means including an electric furnace to melt and solidify the brazing materials for completing a package.

It should be noted that, as constituent materials for a seal cover main body, KOVAR (Fe—Ni—Co alloy) and 42 Alloy (Fe—Ni alloy) are generally used. As a brazing material, a Au—Sn brazing material is used for the good reason that it is excellent in reliability and corrosion resistance. Especially, the generally used is a Au80 wt %-Sn20 wt % brazing material, which has an eutectic structure. In a manufacturing process of the seal cover, the seal cover main body is subjected to Ni plating and/or Au plating for insuring both corrosion resistance of the seal cover and wettability of molten Au—Sn brazing material, and Au—Sn brazing material is allowed to join to form a seal cover. Such joining of Au—Sn brazing material is effected though for instance fusion or pressure welding. Japanese Patent Application Laid-Open No. 2003-142615 is a document, which discloses a method of manufacturing a seal cover through pressure welding of a brazing material.

When a seal cover is joined to a base in manufacturing a semiconductor package, nondefective joining is demanded for insuring production yield. The above-mentioned joining with the use of a conventional seal will offer good joining basically, however voids generate at the joint on very rare occasions.

A rejection rate of products due to the defect is of the order of 1-2% of the entire products, which is small by ratio. However, the number of semiconductor packages mass produced with the popularization of various electronic equipment is quite a few even if the proportion is small, and a loss suffered thereby should not be left disregarded.

SUMMARY OF THE INVENTION

In view of the above problems, it is an object of the present invention to provide a hermetic seal cover capable of inhibiting more effectively such a defect from generating, and a method of manufacturing the seal cover.

In order to solve the above problem, the present inventors made intensive studies on causes of voids generated at the joint during joining of a seal cover, namely during sealing a package. Consequently, they considered one of factors of generating voids is ascribable to that Ni plating layer and Sn contained in the brazing material are alloyed on a surface of the seal cover main body during melting of Au—Sn brazing material in joining the seal cover, and outgas caused by the alloying reaction will remain in the brazing material to generate voids at the joint.

Under the circumstances, the present inventors considered any means for inhibiting alloying of Ni plating layer and Sn in the brazing material, which occurs as described above during joining of a seal cover. They consequently discovered a method of inhibiting additional reaction between the Ni plating layer and the brazing material by providing preliminarily a Ni—Sn alloy layer between the Ni plating layer on the surface of the seal cover main body and Au—Sn brazing material, and by allowing the alloy layer to act as a barrier layer.

More specifically, the present invention is a hermetic seal cover, which comprises: a seal cover main body; a Ni plating layer applied onto a surface of the seal cover main body; and a Au—Sn brazing material layer fusion bonded to a surface of the Ni plating layer, and is characterized by having a Ni—Sn alloy layer between the Ni plating layer and the Au—Sn brazing material layer.

In the present invention, the Ni—Sn alloy layer provided preliminarily as a barrier layer between the Ni plating layer and the Au—Sn brazing material layer inhibits alloying of the Ni plating layer and a molten brazing material. The Ni—Sn alloy layer is an intermetallic compound, which protects the Ni plating layer without melting even when the Au—Sn brazing material melts, and inhibits a reaction between Ni plating layer and the brazing material. Thus, according to the present invention, no outgas will be generated when a brazing material is molten during a process of joining a seal cover, and no voids will remain at a joint after joining or solidification.

Thickness of the Ni—Sn alloy layer as a barrier layer preferably ranges between 0.6 μm and 5.0 μm. Any Ni—Sn alloy layers having a thickness smaller than 0.6 μm will be hard to function as a barrier layer. This is because nickel and brazing material show an alloying reaction albeit only slightly, thereby generating outgas. In contrast, any alloy layers having a thickness exceeding 5.0 μm will be hard to be formed uniformly, thereby fluctuating easily in height of a cover.

It is preferable if the Au—Sn brazing material of the seal cover according to the present invention shows a substantially eutectic structure. The reason a brazing material having a eutectic structure is preferable is that a melting point is stable in joining, and melting and solidifying of the brazing material can be effected quickly, whereby efficient manufacturing of packages can be achieved. Furthermore, such a brazing material has good wettability, and can form joints with fewer defects. The present inventors propose 20.65-23.5 wt % of Sn—Au as a preferable composition for a Au—Sn brazing layer.

The above composition range is slightly different from that, i.e. 20 wt % of Sn—Au, which has been conventionally regarded as a eutectic point in a Au—Sn alloy. The composition proposed by the present inventors was clarified by dint of reiterated substantive tests conducted by the present inventors, and is based on confirmation that a Au—Sn alloy shows a complete eutectic structure when the composition is of 20.65 wt % irrespective of a cooling velocity and specimen size in casting. Thus, the composition of the brazing material layer determined in the above range will define a composition range, which will allow joining of a seal cover based on the eutectic point. More specifically, the reason that the present inventors consider an upper limit of a Sn content be defined as 23.5 wt % is that Sn content exceeding 23.5 wt % contributes to liquidus temperature of a brazing material layer being 320° C. or higher, which may trigger poor joint.

The thickness of the Au—Sn brazing material layer is preferably in the range of 5-100 μm. The reason is that a thickness of smaller than 5 μm will come short in volume of a brazing material, whereby causing a defect to sealing, and a thickness exceeding 100 μm has so much volume, which will cause a defect where a brazing material climbs to a surface of the seal cover during sealing.

A manufacturing method of the hermetic seal cover of the present invention includes basic processes, which are identical to those of the conventional methods. The processes include steps of applying Ni plating onto a seal cover main body, and fusing a Au—Sn brazing layer thereto, however considerations are required in that a Ni—Sn alloy layer is formed at an interface between a Ni plating layer and the Au—Sn brazing layer, and in that the composition of the Au—Sn brazing layer should be adjusted within an adequate range after formation of the alloy layer. Hereinafter, description is made with regard to the manufacturing method.

Formation of the Ni alloy layer on the seal cover main body is made according to a method, which is not different from the conventional ones in particular. The thickness of the Ni plating layer is generally adjusted to 0.5-3 μm, and the present invention also follows suit. Some plating methods including an electrolytic barrel plating are applied as a method of Ni plating. Au plating may be applied onto the surface of the Ni plating layer subsequent to Ni plating. The Au plating is carried out in order to further improve the wettability of the brazing material during fusing the Au—Sn brazing material. It should be noted the Au plating is integrated with the brazing material during fusion of the brazing material, whereby affecting nothing to a formation a Ni—Su alloy layer. Au plating layer is preferably applied with a thickness of 0.01-1.0 μm.

Subsequent to application of Ni plating and, as the case may be, Au plating, Au—Sn brazing material is to be fusion bonded. The Ni—Sn alloy layer is formed through adjusting fusing temperature and heating time in fusion bonding the brazing material, and the Ni—Sn alloy layer can be formed through heating and fusion bonding the Au—Sn brazing material at a higher temperature and longer period of time than those required for the conventional fusion bonding to allow the Ni plating layer and Sn in the brazing material to react fully each other. Conditions of the fusion bonding require a heating temperature of 310-350° C. and heating time of 0.1-10 minutes. Any values lower than the above lower limits cannot perform satisfactory reaction, whereby cannot form a Ni—Sn alloy layer having a thickness capable of functioning as a barrier layer. In contrast, any values exceeding the above higher limits will advance a reaction for forming an alloy layer too much and therefore make the Sn content in the brazing material 20.65% or lower, thereby making the structure oversized. Therefore, it is considered that such pressure welding at a lower temperature as discussed in the above prior art will not be able to form a Ni—Sn alloy layer during joining a brazing material, whereby outgas will not be inhibited from being generated, in contrast to an object of the present invention.

Another point to keep in mind in fusion bonding of the Au—Sn brazing material is a composition of a brazing material to be fusion bonded. The present invention requires a sufficient reaction between a Ni plating layer and Sn in the brazing material during fusion bonding of the brazing material, and in this regard the Sn in the brazing material will be absorbed into the Ni plating layer as the Ni—Sn alloy layer develops. In the seal cover according to the present invention, it is preferable if the Au—Sn brazing material has a Sn content of 20.65-23.5 wt % and a eutectic structure, so that it is necessary to fusion bond a brazing material of which composition should fall within the above-discussed range upon completion of the fusion bonding, in consideration of a reduced Sn content during the fusion bonding. The present invention requires an application of an Au—Sn brazing material to be fusion bonded, which has a Sn content of 22-25 wt %. If a brazing material having a Sn content deviating from the range is fusion bonded, the composition of a solidified brazing material will depart substantially from the eutectic point, i.e. Sn content of 20.65 wt %, and either Au rich phase or Sn rich phase will be generated in the brazing material to deteriorate a joint condition in the manufacture of packages.

Fusion bonding of a brazing material in consideration of the above-described composition of a brazing material being fusion bonded and conditions for fusion bonding will form a Ni—Sn alloy layer as a barrier layer between a Ni-plating layer and a brazing material layer, and the brazing material layer will assume a substantially eutectic composition, which will be preferable in manufacturing seal covers. Reaction between the Ni—Sn alloy layer and the brazing material in fusion bonding of the brazing material will generate gas, however which gas will be released into atmosphere via the brazing material being molten, with a surface on a side of a seal cover brazing material in fusion bonding made exposed. Thus, gas will not remain in the brazing material to leave voids, thereby providing a uniform brazing material layer. It should be understood that the shape of the brazing material being fusion bonded is not specifically limited, and for instance, a sheet-shaped brazing material may be appropriately processed before being placed on a seal cover main body for fusion bonding, or a brazing material in paste form may be printed onto a seal cover main body for fusion bonding.

The above-described hermetic seal cover of the present invention does not generate any outgas during a joining step in manufacture of a packages, whereby the incidence of defective joint of a seal cover will be substantially decreased. In this connection, the conventional hermetic seal covers has been involving risk of damaging semiconductor devices in a package due to outgas, especially a problem of decreasing vibration frequency of a quartz oscillator due to outgas adsorbed thereon. The present invention eliminates such damage to semiconductor devices. Thus, the present invention can curb deterioration of production yield as well as rise in a product cost in mass production of semiconductor packages, which are expected to expand in demand to the future.

BEST MODE FOR CARRYING OUT THE INVENTION

Hereinafter, preferred embodiments of the present invention will be concretely described. In the embodiments, Au—Sn brazing materials of various compositions were used to manufacture hermetic seal covers with the conditions of fusion bonding changed, each structure was observed, and further packages were manufactured for studying failure rate.

The seal covers were manufactured in a manner as follows. On a seal cover main body (Size: 3.5 mm×3.5 mm0.1 ×mm) made of KOVAR, 2.0 µm of Ni and 0.1 µm of Au were plated through electrolytic barrel plating. Then, a frame of Au—Sn brazing material (Size: 5 mm Sq.×2.5 mm Sq., 0.05 mm in thickness) was fusion bonded to the seal cover main body under various conditions to manufacture a seal cover. Fusion bonding of the brazing material was effected by positioning and placing the brazing material on the seal cover main body, subsequently inserting the same into an electric furnace for heating for a predetermined period of time.

The seal cover thus manufactured was observed in terms of the cross section with the use of SEM, for investigating presence or absence as well as thickness of the Ni—Sn alloy layer, and the structure of the Au—Sn brazing material layer.

In manufacturing packages with the use of a seal cover thus produced, the seal cover was joined to a ceramic base on which semiconductor devices (SAW filter) had been equipped. The welding temperature of the seal cover was set to 340° C. The wettability of the brazing material in welding was visually inspected, and the structure of the joint. Further, transmitted X-ray observation was conducted to determine amount of voids generated based on area ratio, i.e. void area/ joint area.

Manufacturing conditions and analysis results of the seal cover produced as above are shown in Table 1.

Figure 1:
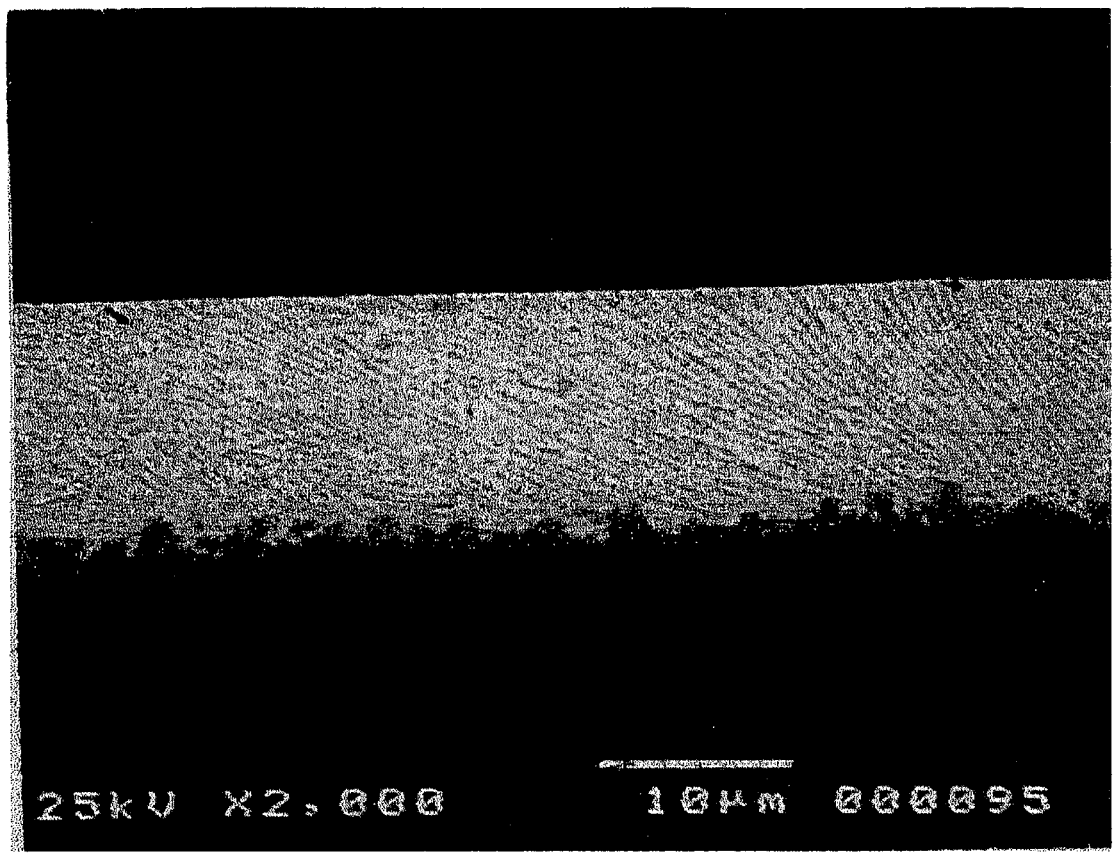
FIG. 1 is a photograph showing a cross-section structure of a joint of a No. 8 sample according to Embodiment.

As will be understood from the results shown in Table 1, the structure of a brazing material will affect the quality of wettability, and if the thickness of a Ni—Sn alloy layer is small, the amount of voids generated will rise. As an example, FIG. 1 shows a cross-section photograph of the No. 8 seal cover defined as a preferable one. In such a good seal cover, it has been observed that a Ni—Sn alloy layer grows and a brazing material layer shows a fine eutectic structure.

Figure 2:
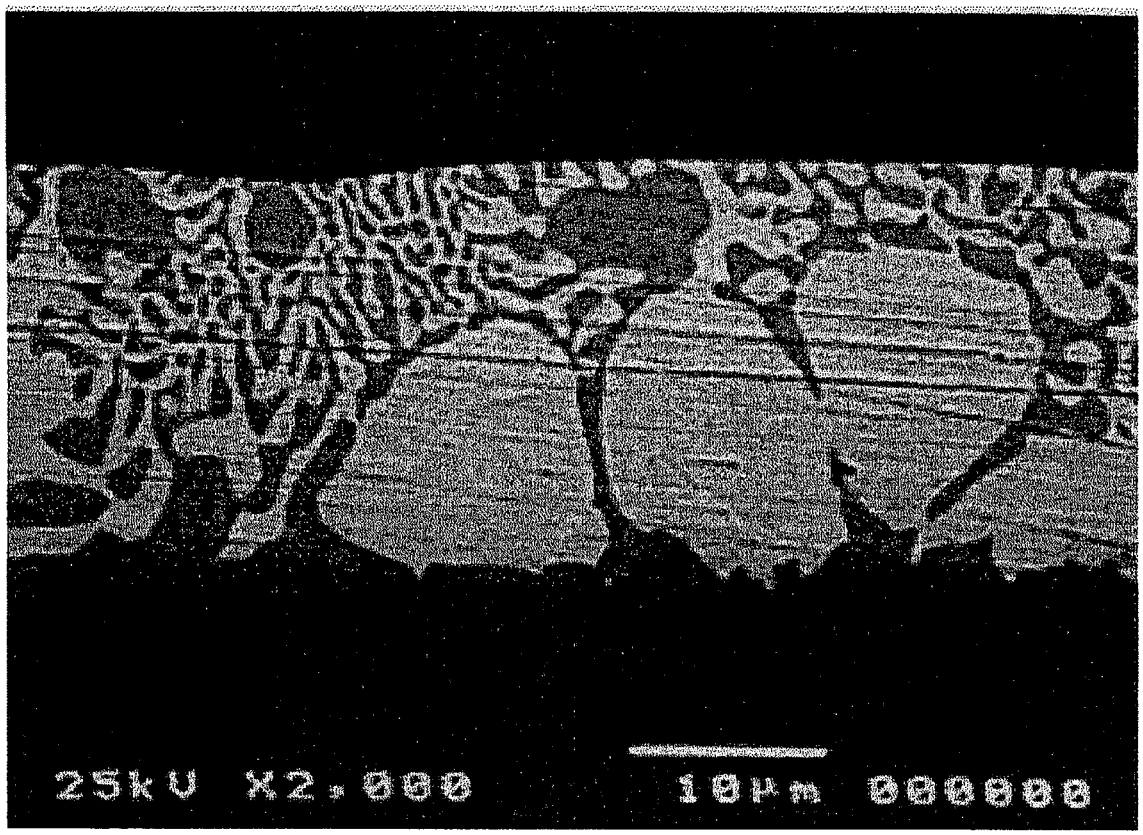
FIG. 2 is a photograph showing a cross-section structure of a joint of a No. 2 sample according to Embodiment.

In order to manufacture a preferable seal cover, the composition of a brazing material in fusion bonding needs to have a Sn content of 22 wt % or higher. In a case where a brazing material having a Sn content of 21 wt % or lower is applied, if fusion bonding temperature is low, Ni—Sn alloy layer has not grown and thereby will generate voids, make a Sn content in a brazing material having a higher fusion bonding temperature deteriorate and the structure oversized, and wettability will be deteriorated. The oversize is considered ascribable to growth of a Au-rich phase due to Sn shortage. For example, in the No. 2 sample having a Sn content of 20%, oversized structure has been observed as FIG. 2 shows.

Figure 3:
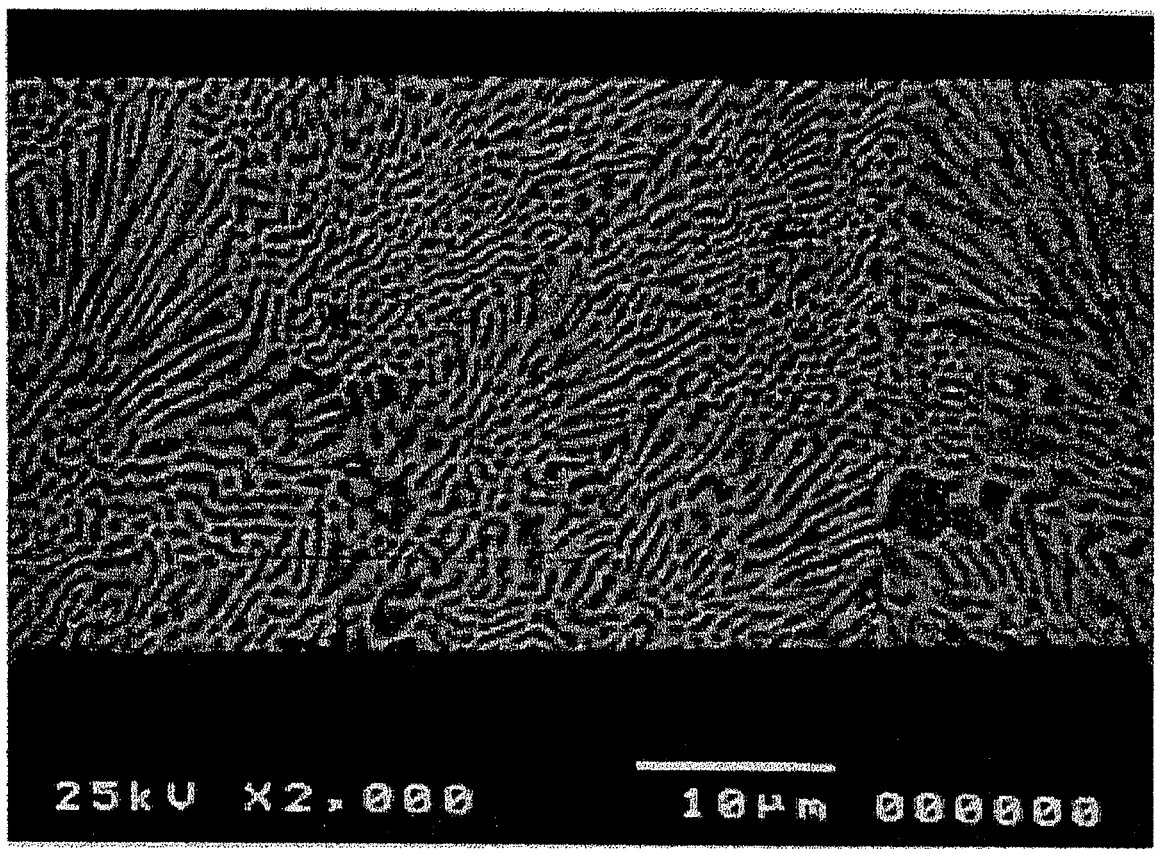
FIG. 3 is a photograph showing a cross-section structure of a joint of a No. 7 sample according to Embodiment.
Figure 4:
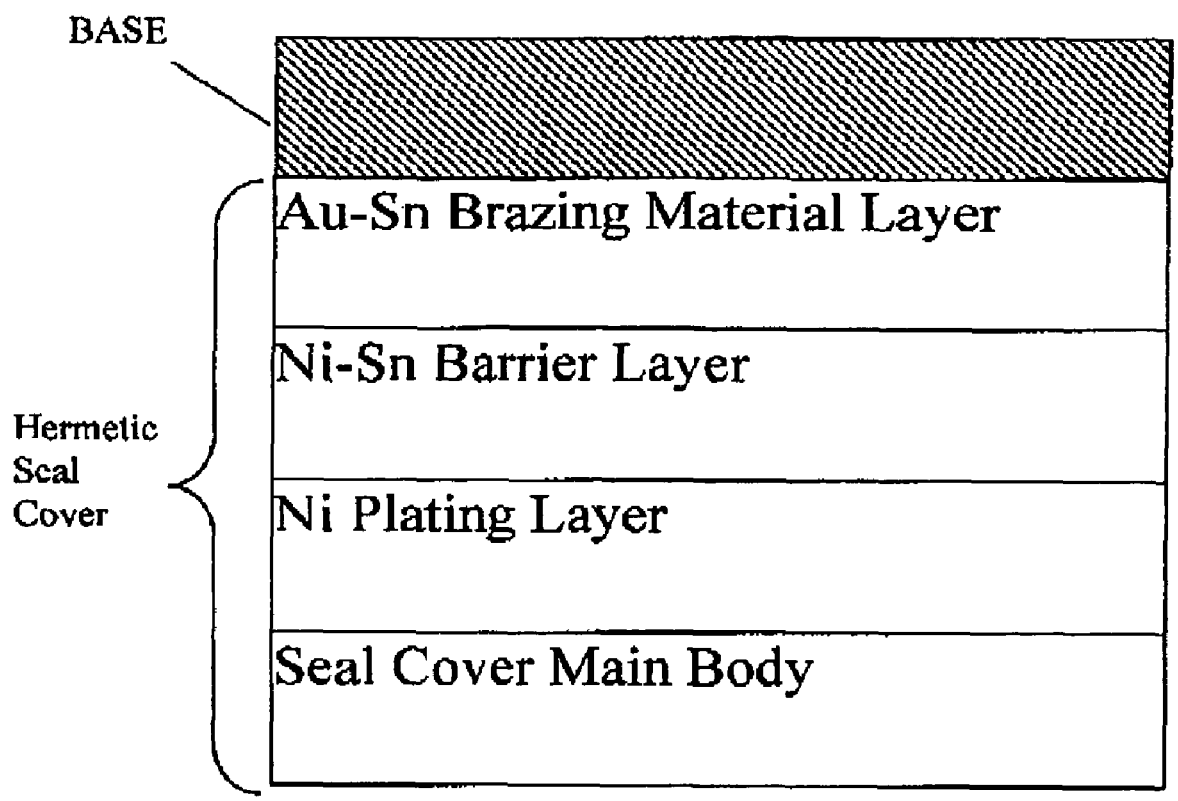
FIG. 4 is a schematic representation of the hermetic seal cover layers according to the invention.
Figure 5:
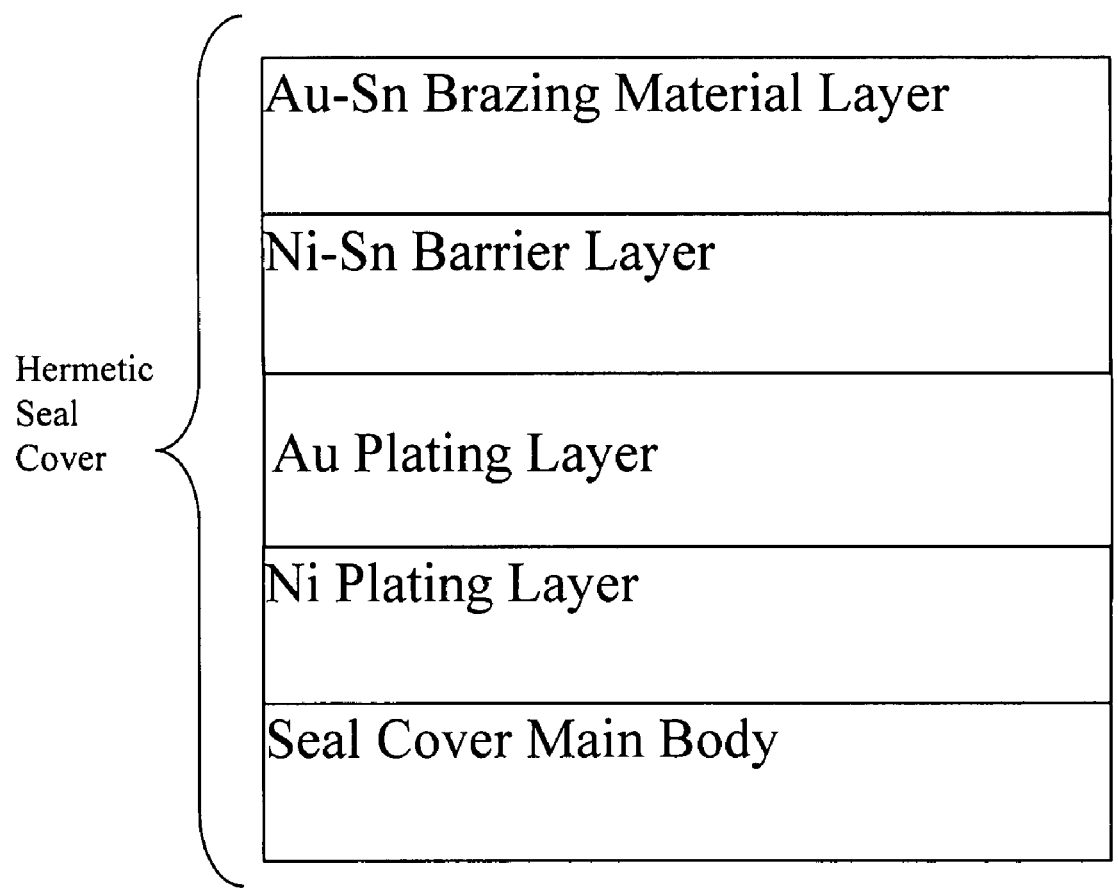
FIG. 5 is a schematic representation of the hermetic seal cover layers according to the invention, further including an Au plating layer.

However, even in a sample having a Sn content of 22%, generation of voids has been observed in the No. 7 sample having a low fusion bonding temperature. This phenomenon is ascribable to generation of outgas in sealing a package because of insufficient formation of a Ni—Sn alloy layer as a barrier layer due to a low fusion bonding temperature. Cross-section structure of No. 7 sample is shown in FIG. 3. FIG. 4 is a schematic representation of the hermetic seal cover layers according to the invention. FIG. 5 is a schematic representation of the hermetic seal cover layers according to the invention, further including an Au plating layer.

What is claimed is:

1. A hermetic seal cover not including a base, which hermetic seal cover comprises: a seal cover main body; a Ni plating layer applied onto a surface of the seal cover main body; a barrier layer consisting essentially of a Ni—Sn alloy on the Ni plating layer; a Au—Sn brazing material layer on

TABLE 1

| No. | Composition of brazing material | Fusion bonding temperature | Fusion bonding time | Thickness of Ni—Sn layer (µm) | Structure of brazing material | Generation of voids (%) | Wettability | Overall determination |
|---|---|---|---|---|---|---|---|---|
| 1 | Au-20Sn | 290° C. | 5 min. | 0.2 | eutectic | 2.1 | ○ | X |
| 2 |  | 310° C. | 10 min. | 0.6 | oversized | 0.5 | Δ | X |
| 3 |  | 330° C. | 10 min. | 1.0 | oversized | 0.3 | X | X |
| 4 | Au-21Sn | 290° C. | 5 min. | 0.2 | eutectic | 1.5 | ◎ | Δ |
| 5 |  | 310° C. | 10 min. | 1.6 | eutectic | 0.2 | ○ | ○ |
| 6 |  | 330° C. | 10 min. | 1.8 | oversized | <0.1 | Δ | Δ |
| 7 | Au-22Sn | 290° C. | 5 min. | 0.3 | eutectic | 2.0 | ◎ | Δ |
| 8 |  | 310° C. | 10 min. | 1.7 | eutectic | <0.1 | ◎ | ◎ |
| 9 |  | 330° C. | 10 min. | 2.0 | eutectic | <0.1 | ◎ | ◎ |
| 10 | Au-23Sn | 290° C. | 5 min. | 0.4 | eutectic | 1.9 | ◎ | Δ |
| 11 |  | 310° C. | 10 min. | 1.5 | eutectic | <0.1 | ◎ | ◎ |
| 12 |  | 330° C. | 10 min. | 1.9 | eutectic | <0.1 | ◎ | ◎ |
| 13 | Au-24Sn | 290° C. | 5 min. | 0.4 | eutectic | 2.3 | ◎ | Δ |
| 14 |  | 310° C. | 10 min. | 1.8 | eutectic | <0.1 | ◎ | ◎ |
| 15 |  | 330° C. | 10 min. | 2.2 | eutectic | <0.1 | ◎ | ◎ |
| 16 | Au-25Sn | 290° C. | 5 min. | 0.5 | eutectic | 1.7 | ◎ | Δ |
| 17 |  | 310° C. | 10 min. | 1.9 | eutectic | <0.1 | ◎ | ◎ |
| 18 |  | 330° C. | 10 min. | 2.2 | eutectic | <0.1 | ◎ | ◎ |

In terms of wettability and overall determination, symbols indicate:
◎ very good
○ good
Δ poor
X very poor the barrier layer, which Au—Sn brazing material layer has a Sn content of 20.65-23.5 wt %;

wherein the barrier layer inhibits a reaction between the Ni plating layer and the Au—Sn brazing material layer when a base is joined to the hermetic seal cover via the Au—Sn brazing material layer with the use of heat.

2. The hermetic seal cover according to claim 1, wherein a thickness of the Ni—Sn alloy layer is 0.6-5.0 μm.

3. The hermetic seal cover according to claim 1 wherein the Au—Sn brazing material layer has a thickness in the range of 5-100 μm.

4. The hermetic seal cover according to claim 1 wherein the Ni plating layer has a thickness in the range of 0.5-3 μm.

* * * * *